(12) United States Patent
Lee et al.

(10) Patent No.: US 9,041,704 B2
(45) Date of Patent: May 26, 2015

(54) PIXEL AND ORGANIC LIGHT EMITTING DISPLAY USING THE SAME

(71) Applicant: Samsung Display Co., Ltd., Yongin, Gyeonggi-Do (KR)

(72) Inventors: Hae-Yeon Lee, Yongin (KR); Bo-Yong Chung, Yongin (KR); Yong-Jae Kim, Yongin (KR); Jung-Bae Kim, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 57 days.

(21) Appl. No.: 14/040,522

(22) Filed: Sep. 27, 2013

(65) Prior Publication Data

US 2014/0333600 A1 Nov. 13, 2014

(30) Foreign Application Priority Data

May 13, 2013 (KR) .......................... 10-2013-0053665

(51) Int. Cl.
*G09G 3/32* (2006.01)
*H01L 27/32* (2006.01)

(52) U.S. Cl.
CPC .......... *H01L 27/3262* (2013.01); *G09G 3/3291* (2013.01); *G09G 3/325* (2013.01); *G09G 2300/0465* (2013.01); *G09G 2300/0814* (2013.01); *G09G 2300/0819* (2013.01); *G09G 2300/0852* (2013.01); *G09G 2300/0861* (2013.01); *G09G 2310/08* (2013.01)

(58) Field of Classification Search
CPC .......................... H01L 27/3262; G09G 3/3291
USPC .............. 345/212, 82, 74, 44–49, 36; 257/40; 313/496–497, 504, 462
See application file for complete search history.

(56) References Cited

U.S. PATENT DOCUMENTS

| 7,916,102 | B2 * | 3/2011 | Chung et al. ..................... 345/82 |
| 8,441,421 | B2 * | 5/2013 | Han et al. ......................... 345/82 |
| 8,466,855 | B2 * | 6/2013 | Han ................................. 345/76 |
| 8,614,655 | B2 * | 12/2013 | Park ................................ 345/76 |
| 8,643,575 | B2 * | 2/2014 | Kim ................................ 345/82 |
| 8,803,768 | B2 * | 8/2014 | Kimura et al. .................. 345/76 |
| 8,902,208 | B2 * | 12/2014 | Chung et al. ................... 345/211 |
| 2005/0017934 | A1 | 1/2005 | Chung et al. |
| 2008/0211397 | A1* | 9/2008 | Choi ............................. 313/504 |

(Continued)

FOREIGN PATENT DOCUMENTS

| KR | 10-2005-0005646 A | 1/2005 |
| KR | 10-2012-0048294 A | 5/2012 |
| KR | 10-2014-0065937 A | 5/2014 |

*Primary Examiner* — Allison Johnson
*Assistant Examiner* — Vinh Lam
(74) *Attorney, Agent, or Firm* — Knobbe, Martens, Olson & Bear, LLP

(57) ABSTRACT

A pixel circuit for an organic light emitting diode (OLED) display is disclosed. One inventive aspect includes an organic light emitting diode, a first transistor, a second transistor, a first capacitor connected to a second node and a fixed voltage source, a third transistor, a fourth transistor, a second capacitor connected to the fourth transistor and a third node, a first control transistor and a second control transistor. The fourth transistor is connected to the first and third nodes and is turned off when an emission control signal is supplied to an emission control line and turned on otherwise. The first control transistor is connected to the third node and the first power source and is turned on when a first control signal is supplied.

20 Claims, 5 Drawing Sheets

(56) References Cited

U.S. PATENT DOCUMENTS

2011/0063266 A1* 3/2011 Chung et al. .................. 345/205
2011/0141000 A1* 6/2011 Han et al. ........................ 345/82
2012/0113077 A1   5/2012 Kang
2014/0139408 A1   5/2014 Kim et al.

* cited by examiner

PIXEL AND ORGANIC LIGHT EMITTING DISPLAY USING THE SAME

CROSS-REFERENCE TO RELATED APPLICATIONS

This application claims priority to and the benefit of Korean Patent Application No. 10-2013-0053665, filed on May 13, 2013, in the Korean Intellectual Property Office, the entire contents of which are incorporated herein by reference in their entirety.

BACKGROUND

1. Field

The disclosed technology relates generally to an organic light emitting diode (OLED) pixel circuit and an OLED display for improving display quality, decreasing circuit layout, reducing power consumption and compensate for electromagnetic interference (EMI).

2. Description of the Related Technology

Flat panel display technologies have been developed which have less weight and volume and which can thus replace cathode ray tubes that are bulky and heavy. Many flat panel displays include such technologies as liquid crystal display, field emission display, plasma display panel, organic light emitting diode display device, etc.

Among the flat panel displays, the organic light emitting diode display devices display images using organic light emitting diodes (OLED) that generate light by recombination of electrons and holes. The organic light emitting diode display devices show fast response speed and low power consumption.

SUMMARY OF CERTAIN INVENTIVE ASPECTS

One inventive aspect relates to a pixel and an organic light emitting diode display using the same, which can improve display quality.

According to an aspect of the disclosed technology, there is disclosed an organic light emitting diodes (OLED) pixel circuit including an organic light emitting diode, a first transistor configured to have a gate electrode connected to a first node, a first electrode connected to a first power source via a third node, and a second electrode connected to an anode electrode of the organic light emitting diode, a second transistor connected to a data line and a second node, the second transistor being turned on when a scan signal is supplied to a scan line, a first capacitor connected to the second node and a fixed voltage source, a third transistor connected between the second and first nodes, the third transistor being turned on when a second control signal is supplied, a fourth transistor connected between the first and third nodes, the fourth transistor being turned off when an emission control signal is supplied to an emission control line and turned on otherwise, a second capacitor connected to the fourth transistor and the third node, a first control transistor connected to the third node and the first power source, the first control transistor being turned on when a first control signal is supplied, and a second control transistor connected in parallel to the first control transistor between the third node and the first power source, the second control transistor being simultaneously turned on or turned off with the fourth transistor.

In another exemplary implementation of the pixel circuit, a turn-on period of the fourth transistor does not overlap with a turn-on period of the third transistor.

In another exemplary implementation of the pixel circuit, a turn-on period of the first control transistor does not overlap with a turn-on period of the third transistor.

In another exemplary implementation of the pixel circuit, a turn-on period of the fourth transistor partially overlaps with a turn-on period of the first control transistor.

In another exemplary implementation of the pixel circuit, the pixel further includes a fifth transistor connected to the data line and a fourth node that is a common node of the second capacitor and the fourth transistor, a sixth transistor connected to the fourth node and the data line, and a ninth transistor connected to the fixed voltage source and the anode electrode of the organic light emitting diode. The fifth transistor is configured to be turned on or turned off simultaneously with the first control transistor. The sixth transistor is configured to be turned on or turned off simultaneously with the third transistor. The ninth transistor is configured to be turned on or turned off simultaneously with the third transistor.

In another exemplary implementation of the pixel circuit, the voltage of the fixed voltage source is set so that current flows through the first transistor when the ninth transistor is turned on.

In another exemplary implementation of the pixel circuit, the pixel may further include a tenth transistor connected to the fixed voltage source and a common node of the ninth and first transistors, and an eleventh transistor connected to the organic light emitting diode and the common node of the ninth and first transistors. The tenth transistor is configured to be turned on or turned off simultaneously with the fifth transistor. The eleventh transistor is configured to be turned on or turned off simultaneously with the fourth transistor.

In another exemplary implementation of the pixel circuit, the pixel may further include a tenth transistor connected to the fixed voltage source and the organic light emitting diode, and an eleventh transistor connected to the organic light emitting diode and the common node of the ninth and first transistors. The tenth transistor is configured to be turned on or turned off simultaneously with the fifth transistor. The eleventh transistor is configured to be turned on or turned off simultaneously with the fourth transistor.

According to an aspect of the disclosed technology, there is provided an organic light emitting diode display, including: a control driver, a scan driver, a data driver and pixels. The control driver is configured to supply a first control signal to a first control line during a first period and a second period of one frame, and supply a second control signal to a second control line during a third period of the frame. The scan driver is configured to progressively supply a scan signal to scan lines during a fourth period of the frame, and supply an emission control signal to an emission control line during the second and third periods. The data driver is configured to supply a bias voltage to data lines during the first period, supply a reference power source to the data lines during the second and third periods, and supply a data signal to the data lines during the fourth period. The pixels are positioned in an area defined by the scan lines and the data lines. Each of the pixels includes a first transistor, a first capacitor and a second capacitor stores a voltage in response to a voltage of the data signal in the first capacitor during the fourth period, and charges a voltage in response to the voltage of the data signal and a threshold voltage of the first transistor of the second capacitor using the voltage stored in the first capacitor during the third period. The second capacitor is electrically decoupled from the first capacitor.

In another exemplary implementation of the organic light emitting diode display, the data driver may supply an on-bias voltage at which the first transistor is turned on during the first period.

In another exemplary implementation of the organic light emitting diode display, the data driver may supply an off-bias voltage at which the first transistor is turned off during the first period.

In another exemplary implementation of the organic light emitting diode display, the reference power source may be set to a specific voltage within a voltage range of the data signal.

In another exemplary implementation of the organic light emitting diode display, each pixel includes an organic light emitting diode, a first transistor configured to have a gate electrode connected to a first node, a second transistor connected to a specific data line and a second node, a first capacitor connected to the second node and a fixed voltage source, a third transistor connected to the second and first nodes, a fourth transistor connected to the first and third nodes, a second capacitor connected to the fourth transistor and the third node, a first control transistor connected to the third node and the first power source, and a second control transistor connected in parallel to the first control transistor between the third node and the first power source. The first electrode is connected to a first power source via a third node, and a second electrode connected to an anode electrode of the organic light emitting diode. The second transistor is configured to be turned on when a scan signal is supplied to a scan line. The third transistor is configured to be turned on when the second control signal is supplied. The fourth transistor is configured to be turned on when the emission control signal is supplied and turned off otherwise. The first control transistor is configured to be turned on when the first control signal is supplied. The second control transistor is configured to be turned off when the emission control signal is supplied and turned on when the emission control signal is not supplied.

In another exemplary implementation of the organic light emitting diode display, a turn-on period of the fourth transistor does not overlap with a turn-on period of the third transistor.

In another exemplary implementation of the organic light emitting diode display, a turn-on period of the first control transistor does not overlap with a turn-on period of the third transistor.

In another exemplary implementation of the organic light emitting diode display, a turn-on period of fourth transistor partially overlaps with a turn-on period of the first control transistor.

In another exemplary implementation of the organic light emitting diode display, each of the pixels further includes a fifth transistor connected to the specific data line and a fourth node that is a common node of the second capacitor and the fourth transistor, a sixth transistor connected in parallel to the fifth transistor between the fourth node and the specific data line, and a ninth transistor connected to the fixed voltage source and the anode electrode of the organic light emitting diode. The fifth transistor is configured to be turned on when the first control signal is supplied. The sixth transistor is configured to be turned on when the second control signal is supplied. The ninth transistor is configured to be turned on when the second control signal is supplied.

In another exemplary implementation of the organic light emitting diode display, the voltage of the fixed voltage source is set so that current flows the first transistor when the ninth transistor is turned on.

In another exemplary implementation of the organic light emitting diode display, each of the pixels further includes a tenth transistor connected to the fixed voltage source and a common node of the ninth and first transistors, and an eleventh transistor connected to the organic light emitting diode and the common node of the ninth and first transistors. The tenth transistor is configured to be turned on when the first control signal is supplied. The eleventh transistor is configured to be turned off when the emission control signal is supplied and turned on when the emission control signal is not supplied.

In another exemplary implementation of the organic light emitting diode display, each of the pixels further includes a tenth transistor connected to the fixed voltage source and the organic light emitting diode, and an eleventh transistor connected to the organic light emitting diode and the common node of the ninth and first transistors. The tenth transistor is configured to be turned on when the first control signal is supplied. The eleventh transistor is configured to be turned off when the emission control signal is supplied and turned on when the emission control signal is not supplied.

BRIEF DESCRIPTION OF THE DRAWINGS

Exemplary embodiments will now be described more fully hereinafter with reference to the accompanying drawings, however, they may be embodied in different forms and should not be construed as limited to the embodiments set forth herein. Rather, these embodiments are provided so that this disclosure will be thorough and complete, and will fully convey the scope of the exemplary embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION OF CERTAIN INVENTIVE EMBODIMENTS

Figure 1:
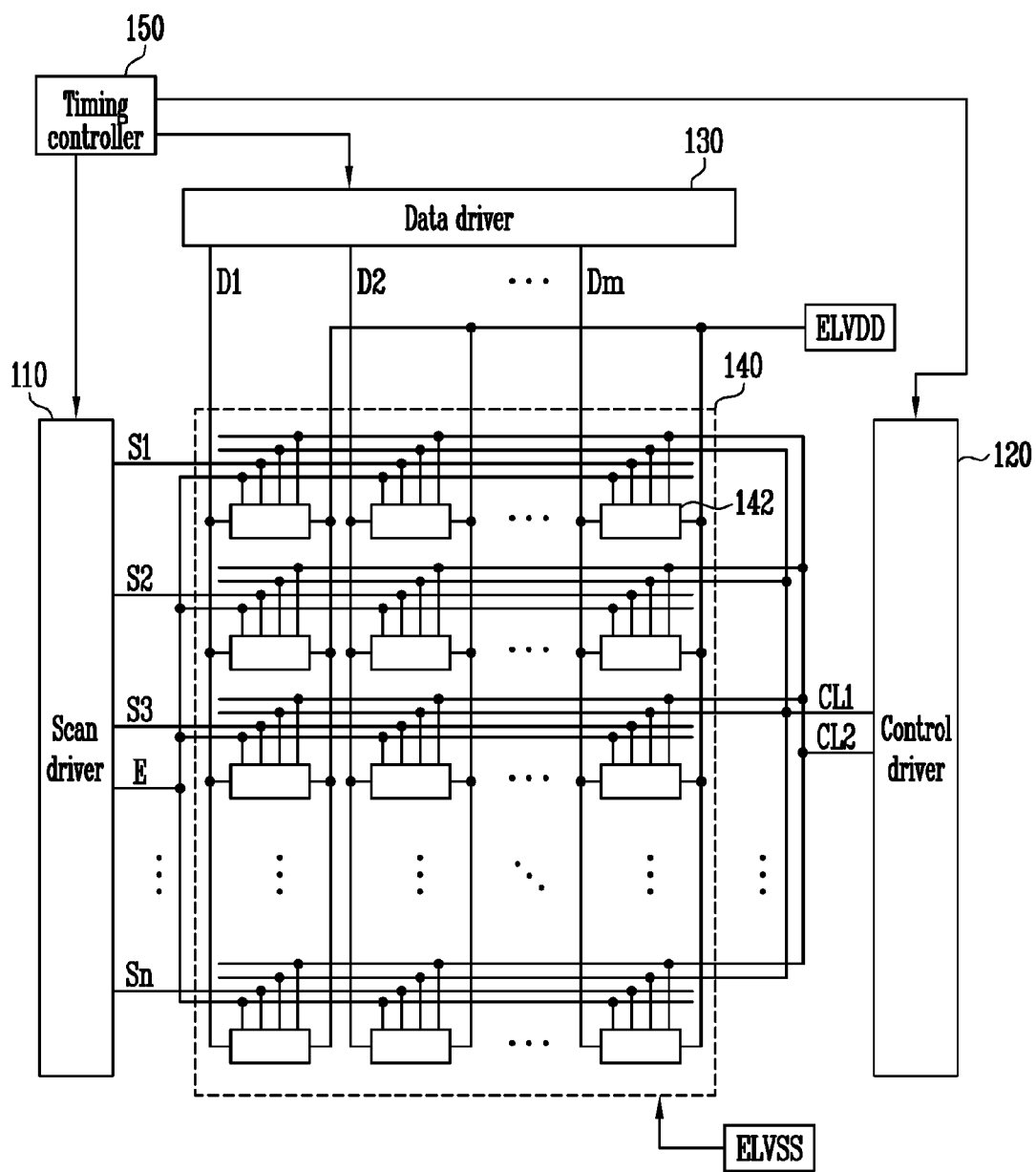
FIG. 1 is a block diagram illustrating an organic light emitting diode display according to an exemplary embodiment of the disclosed technology.

Hereinafter, certain exemplary embodiments according to the disclosed technology will be described with reference to the accompanying drawings, in which exemplary embodiments of the disclosed technology are shown. As those skilled in the art would realize, the described embodiments may be modified in various different ways, all without departing from the spirit or scope of the disclosed technology.

The drawings and description are to be regarded as illustrative in nature and not restrictive. Like reference numerals designate like elements throughout the specification.

Further, since sizes and thicknesses of constituent members shown in the accompanying drawings are arbitrarily given for better understanding and ease of description, the disclosed technology is not limited to the illustrated sizes and thicknesses.

In the drawings, the thickness of layers, films, panels, regions, etc., are exaggerated for clarity. In the drawings, for better understanding and ease of description, the thicknesses of some layers and areas are exaggerated. It will be understood that when an element such as a layer, film, region, or substrate is referred to as being "on" another element, it may be directly on the other element or intervening elements may also be present.

Throughout this specification and the claims that follow, when it is described that an element is "connected" to another element, the element may be "directly connected" to the other element or "electrically connected" to the other element through a third element. In addition, unless explicitly described to the contrary, the word "comprise" and variations such as "comprises" or "comprising" will be understood to imply the inclusion of stated elements but not the exclusion of any other elements. Throughout this specification, it is understood that the term "on" and similar terms are used generally and are not necessarily related to a gravitational reference.

Here, when a first element is described as being connected to a second element, the first element may be not only directly connected to the second element but may also be indirectly connected to the second element via a third element. Further, some of the elements that are not essential to the complete understanding of the disclosed technology are omitted for clarity. Also, like reference numerals refer to like elements throughout.

In addition, in the accompanying drawings, an organic light emitting diode (OLED) display is illustrated as an active matrix (AM)-type OLED display in a 6Tr-1Cap structure in which six thin film transistors (TFTs) and one capacitor are formed in one pixel, but the disclosed technology is not limited thereto. Therefore, the OLED display may have various structures. In one exemplary implementation, a plurality of TFTs and at least one capacitor may be provided in one pixel of the OLED display, and separate wires may be further provided in the OLED display. Here, the pixel refers to a minimum unit for displaying an image, and the OLED display displays an image by using a plurality of pixels.

FIG. 1 is a block diagram illustrating an organic light emitting diode display according to an embodiment of the disclosed technology.

Referring to FIG. 1, the organic light emitting diode display according to this embodiment includes a pixel unit 140, a scan driver 110, a control driver 120, a data driver 130, and a timing controller 150. The pixel unit 140 may include pixels 142 positioned in an area defined by scan lines S1 to Sn and data lines D1 to Dm. The scan driver 110 is configured to drive the scan lines S1 to Sn and an emission control line E. The control driver 120 is configured to drive first and second control lines CL1 and CL2. The data driver 130 is configured to drive the data lines D1 to Dm. The timing controller 150 configured to control the drivers 110, 120 and 130.

The scan driver 110 supplies a scan signal to the scan lines S1 to Sn. In one implementation, the scan driver 110 of FIG. 3 progressively supplies a scan signal to the scan lines S1 to Sn during a fourth period T4 of a frame 1F. The scan driver 110 supplies an emission control signal to the emission control line E commonly connected to the pixels 142. In another implementation, the scan driver 110 supplies an emission control signal to the emission control line E during a second period T2 and a third period T3 of the frame 1F. Here, the scan signal is set to a voltage (e.g., a low voltage) at which a transistor of the pixels 142 can be turned on, and the emission control signal is set to a voltage (e.g., a high voltage) at which the transistor of the pixels 142 can be turned off.

The control driver 120 supplies a first control signal to the first control line CL1 commonly connected to the pixels 142, and supplies a second control signal to the second control line CL2 commonly connected to the pixels 142. In one exemplary implementation, the control driver 120 may supply the first control signal during a first period T1 and the second period T2 of the frame 1F and supply the second control signal during the third period T3.

The data driver 130 supplies a data signal to the data lines D1 to Dm so the data driver 130 is synchronized with the scan signal supplied to the scan lines S1 to Sn during the fourth period T4. The data driver 130 supplies a bias power source Vbias to the data lines D1 to Dm during the first period T1, and supplies a reference power source Vref to the data lines D1 to Dm during the second period T2 and the third period T3. In addition, the bias power source Vbias is set to a voltage (on-bias) at which a driving transistor of each pixel 142 may be turned on or to a voltage (off-bias) at which the driving transistor may be turned off. The reference power source Vref is set to a specific voltage between a voltage range of the data signal.

The timing controller 150 controls the scan driver 110, the control driver 120 and the data driver 130, in response to a synchronization signal supplied from the outside of the organic light emitting diode display.

The pixel unit 140 includes pixels 142 positioned in an area defined by the scan lines S1 to Sn and the data lines D1 to Dm. Each pixel 142 charges a current data signal during the fourth period T4 and simultaneously generates light with a predetermined luminance in response to a previous data signal. Each of the pixels 142 may control the amount of current flowing from a first power source ELVDD to a second power source ELVSS via an organic light emitting diode (not shown) in response to the previous data signal during the fourth period T4.

Meanwhile, although it has been illustrated in FIG. 1 that, for convenience of illustration, the emission control line E is connected to the scan driver 110 and the control lines CL1 and CL2 are connected to the control driver 120, the disclosed technology is not limited thereto. The emission control line E and the control lines CL1 and CL2 may be connected to various drivers configured to supply the waveforms described above. In one exemplary implementation, the emission control line E and the control lines CL1 and CL2 are connected to the scan driver 110.

Figure 2:
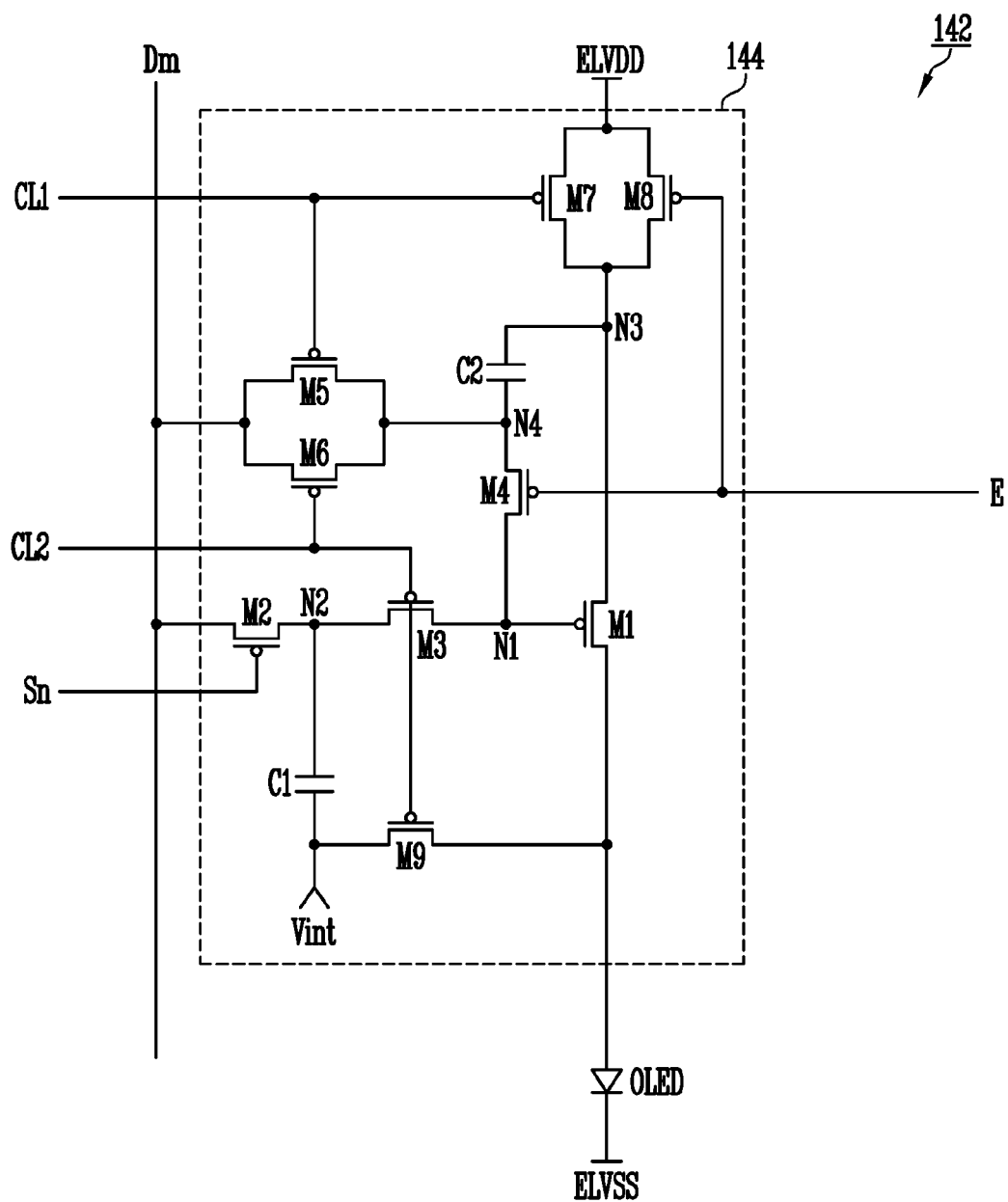
FIG. 2 is a circuit diagram illustrating a first exemplary embodiment of a pixel shown in FIG. 1.

FIG. 2 is a circuit diagram illustrating a first embodiment of the pixel shown in FIG. 1. For convenience of illustration, a pixel connected to an m-th data line Dm and an n-th scan line Sn is shown in FIG. 2.

Referring to FIG. 2, the pixel 142 according to this embodiment includes an organic light emitting diode OLED and a pixel circuit 144 configured to control the amount of current supplied to the organic light emitting diode OLED.

An anode electrode of the organic light emitting diode OLED is connected to the pixel circuit 144, and a cathode electrode of the organic light emitting diode OLED is connected to the second power source ELVSS. The organic light emitting diode OLED generates light with a predetermined luminance in response to an amount of current supplied to the pixel circuit 144. The second power source ELVSS may be set to a voltage lower than a voltage of the first power source ELVDD.

The pixel circuit 144 controls the amount of current supplied to the organic light emitting diode OLED in response to a data signal. In this case, the pixel circuit 144 includes a first transistor M1, a second transistor M2, a third transistor M3, a fourth transistor M4, a fifth transistor M5, a sixth transistor M6, a seventh transistor M7, an eighth transistor M8, a ninth transistor M9, a first capacitor C1 and a second capacitor C2.

A first electrode of the first transistor M1 (i.e., a driving transistor) is connected to a third node N3. A second electrode of the first transistor M1 is connected to the anode electrode of the organic light emitting diode OLED. A gate electrode of the first transistor M1 is connected to a first node N1. The first transistor M1 controls an amount of the current supplied to the organic light emitting diode OLED in response to a voltage applied to the first node N1.

A first electrode of the second transistor M2 is connected to the data line Dm and a second electrode of the second transistor M2 is connected to a second node N2. A gate electrode of the second transistor M2 is connected to the scan line Sn. The second transistor M2 is turned on when a scan signal is supplied to the scan line Sn so that the second transistor M2 supplies a data signal from the data line Dm to the second node N2.

A first electrode of the third transistor M3 is connected to the second node N2 and a second electrode of the third transistor M3 is connected to the first node N1. A gate electrode of the third transistor M3 is connected to the second control line CL2. The third transistor M3 is turned on when the second control signal is supplied to the second control line CL2 so that the second N2 and the first node N1 are electrically connected to each other.

A first electrode of the fourth transistor M4 is connected to a fourth node N4 and a second electrode of the fourth transistor M4 is connected to the first node N1. A gate electrode of the fourth transistor M4 is connected to the emission control line E. The fourth transistor M4 is turned off when an emission control signal is supplied to the emission control line E. The further transistor M4 is turned on when the emission control signal is not supplied to the emission control line E. If the fourth transistor M4 is turned on, the first and fourth nodes N1 and N4 are electrically connected to each other.

A first electrode of the fifth transistor M5 is connected to the data line Dm, and a second electrode of the fifth transistor M5 is connected to the fourth node N4. A gate electrode of the fifth transistor M5 is connected to the first control line CL1. The fifth transistor M5 is turned on when the first control signal is supplied to the first control line CL1 so that the data line Dm and the fourth node N4 are electrically connected to each other.

The sixth transistor M6 is connected in parallel to the fifth transistor M5 between the data line Dm and the fourth node N4. A gate electrode of the sixth transistor M6 is connected to the second control line CL2. The sixth transistor M6 is turned on when the second control signal is supplied to the second control line CL2 so that the data line Dm and the fourth node N4 are electrically connected to each other.

A first electrode of the seventh transistor M7 is connected to the first power source ELVDD and a second electrode of the seventh transistor M7 is connected to the third node N3. A gate electrode of the seventh transistor M7 is connected to the first control line CL1. The seventh transistor M7 is turned on when the first control signal is supplied to the first control line CL1 so the seventh transistor M7 may supply the voltage of the first power source ELVDD to the third node N3.

The eighth transistor M8 is connected in parallel to the seventh transistor M7 between the first power source ELVDD and the third node N3. A gate electrode of the eighth transistor M8 is connected to the emission control line E. The eighth transistor M8 is turned off when an emission control signal is supplied to the emission control line E The eighth transistor M8 is turned on when an emission control signal is not supplied to the emission control line E.

A first electrode of the ninth transistor M9 is connected to the anode electrode of the organic light emitting diode OLED and a second electrode of the ninth transistor M9 is connected to an initialization power source Vint. A gate electrode of the ninth transistor M9 is connected to the second control line CL2. The ninth transistor M9 is turned on when the second control signal is supplied to the second control line CL2 so that the ninth transistor M9 may supply a voltage of the initialization power source Vint to the anode electrode of the organic light emitting diode OLED. The voltage of the initialization power source Vint is set so that the current supplied via the first transistor M1 can be supplied to the initialization power source Vint during a period when the ninth transistor M9 is turned on.

The first capacitor C1 is connected to the second node N2 and a fixed voltage source (e.g., the initialization power source Vint). The first capacitor C1 charges a voltage corresponding to the voltage of a data signal during a period when the second transistor M2 is turned on.

The second capacitor C2 is connected to the third node N3 and the fourth node N4. The second capacitor C2 charges a voltage corresponding to the voltage of the data signal and the threshold voltage of the first transistor M1. Meanwhile, the second capacitor C2 is not charged by sharing electric charges with the first capacitor C1. In other words, the second capacitor C2 is electrically decoupled from the first node N1 during a period when the voltage of the data signal is applied from the first capacitor C1 to the first node N1.

In a case where the second capacitor C2 is not charged by sharing electric charges with the first capacitor C1 as described above, the first capacitor C1 may be set to a capacity similar or identical to that of the second capacitor C2. In a case where the second capacitor C2 is charged by sharing electric charges with the first capacitor C1, the first capacitor C1 is set to a capacity higher (e.g., five times or more) than that of the second capacitor C2. As such, an area of a layout increases.

Figure 3:
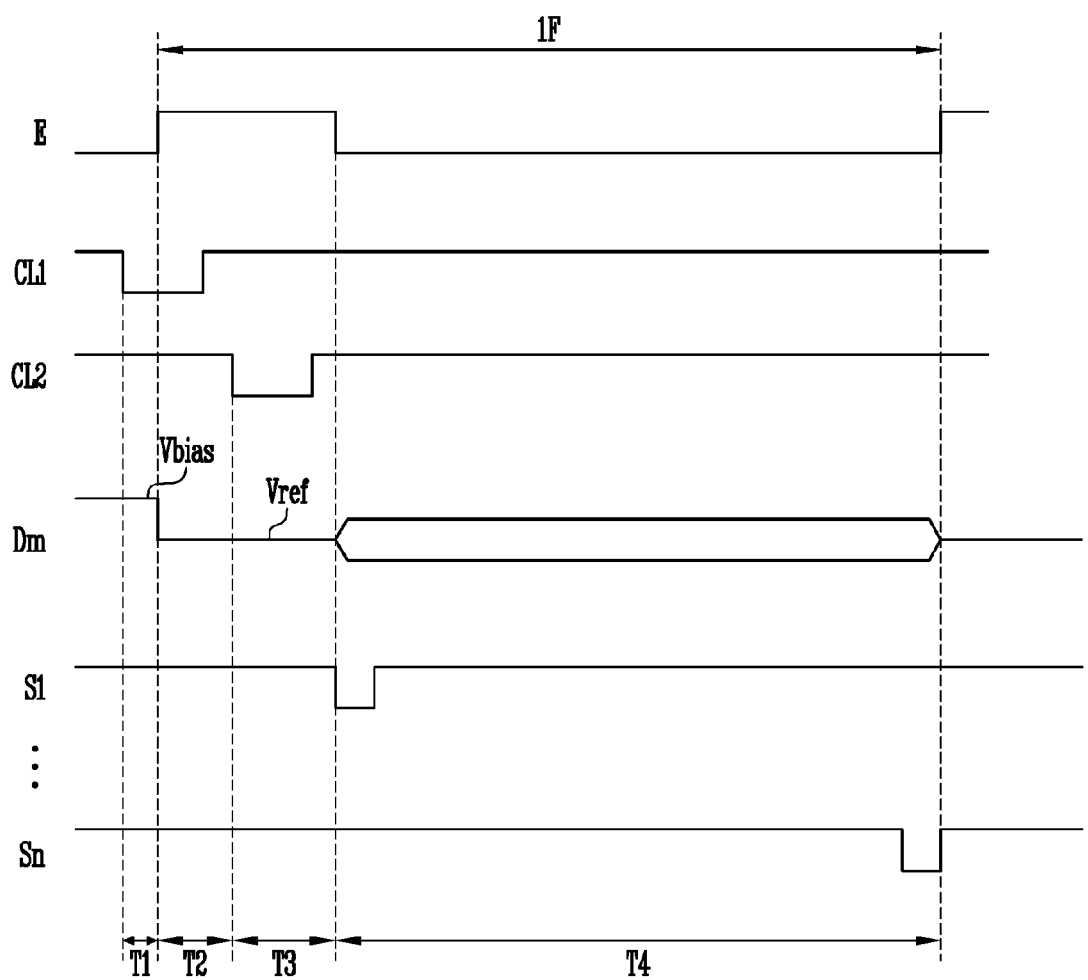
FIG. 3 is a waveform diagram illustrating an exemplary embodiment of a driving method of the pixel shown in FIG. 2.

FIG. 3 is a waveform diagram illustrating an embodiment of a driving method of the pixel shown in FIG. 2.

Referring to FIG. 3, one frame according to this embodiment is divided into a first period T1, a second period T2, a third period T3 and a fourth period T4. The first period T1 is a period when an on-bias or off-bias voltage is applied to the first transistor M1. The second period T2 is a period when the second capacitor C2 is initialized by applying a predetermined voltage to the third and fourth nodes N3 and N4.

The third period T3 is a period when the second capacitor C2 charges a voltage corresponding to the voltage of a data signal and the threshold voltage of the first transistor M1. The organic light emitting diode OLED is initialized during the third period T3. The fourth period T4 is a period when a voltage corresponding to the voltage of the data signal is charged in the first capacitor C1 and simultaneously, the organic light emitting diode OLED generates light with a predetermined luminance in response to the voltage charged in the second capacitor C2.

The operation of the pixel will be described in detail. First, during the first period T1, the first control signal is supplied to the first control line C1, and the voltage of the bias power source Vbias is applied to the data line Dm. If the first control signal is supplied to the first control line CL1, the fifth transistor M5 and the seventh transistor M7 are turned on.

If the seventh transistor M7 is turned on, a voltage of the first power source ELVDD is applied to the third node N3. If the fifth transistor M5 is turned on, a voltage of the bias power source Vbias is applied from the data line Dm to the fourth node N4. In this case, an emission control signal is not supplied to the emission control line E. Therefore, the voltage of the bias power source Vbias is applied to the fourth node N4 and to the first node N1 via the fourth transistor M4. Then, the first transistor M1 is initialized in an on-bias or off-bias state in response to the voltage of the bias power source Vbias. In one exemplary implementation, if the on-bias voltage is applied to the bias power source Vbias, the first transistor M1 is set in the on-bias state during the first period T1. In this case, a voltage characteristic curve of the first transistor M1 is initialized in the on-bias state, regardless of a voltage of a data signal supplied in a previous frame, and accordingly, it is possible to display an image with uniform luminance. Similarly, if the off-bias voltage is applied to the bias power source Vbias, the voltage characteristic curve of the first transistor M1 is initialized in the off-bias state.

During the second period T2, a emission control signal is supplied to the emission control line E and a first control signal is supplied to the first control line CL1. A voltage of the reference power source Vref is applied to the data line Dm during the second period T2. If the emission control signal is supplied to the emission control line E, the fourth transistor M4 and the eighth transistor M8 are turned off. If the fourth transistor M4 is turned off, the electrical coupling between the first node N1 and the fourth node N4 is blocked.

If a first control signal is supplied to the first control line CL1, the fifth transistor M5 and the seventh transistor M7 are turned on. If the fifth transistor M5 is turned on, the voltage of the reference power source Vref is applied from the data line Dm to the fourth node N4. If the seventh transistor M7 is turned on, the voltage of the first power source ELVDD is applied to the third node N3. Then, the second capacitor C2 is initialized in a constant state during the second period T2, regardless of the data signal supplied in a previous frame.

During the third period T3, the supply of the emission control signal to the emission control line E is maintained, and the second control signal is supplied to the second control line CL2. The voltage of the reference power source Vref is applied to the data line Dm during the third period T3. If the second control signal is supplied to the second control line CL2, the third transistor M3, the sixth transistor M6 and the ninth transistor M9 are turned on.

If the sixth transistor M6 is turned on, a voltage of the reference power source Vref from the data line Dm is applied to the fourth node N4. If the ninth transistor M9 is turned on, a voltage of the initialization power source Vint is applied to the anode electrode of the organic light emitting diode OLED so that the organic light emitting diode OLED is initialized. If the ninth transistor M9 is turned on, current from the first transistor M1 is supplied to the initialization power source Vint via the ninth transistor M9.

If the third transistor M3 is turned on, a voltage of the data signal is applied to the first node N1. The voltage of the data signal is stored in the first capacitor C1. In this case, the fourth transistor M4 is set in a turn-off state and hence the second capacitor C2 is not electrically connected to the first capacitor C1. Meanwhile, if the voltage of the data signal is applied to the first node N1, a voltage of the third node N3 drops from a voltage of the first power source ELVDD to a voltage obtained by adding the absolute threshold voltage of the first transistor M1 to the voltage of the data signal. In this case, the second capacitor C2 charges a voltage corresponding to a difference voltage applied to the third node N3 and the fourth node N4. The difference voltage corresponds to a threshold voltage of the first transistor M1 and a voltage of the data signal. Meanwhile, the voltage of the reference power source Vref is set to a specific voltage in the voltage range of the data signal. Thus, the voltage of the data signal is controlled to be higher or lower than that of the reference power source Vref. This thereby implements a predetermined gray scale.

The supply of the emission control signal to the emission control line E is stopped during the fourth period T4. If the supply of the emission control signal to the emission control line E is stopped, the fourth and eighth transistors M4 and M8 are turned on. If the eighth transistor M8 is turned on, the voltage of the first power source ELVDD is applied to the third node N3. If the fourth transistor M4 is turned on, the first and fourth nodes N1 and N4 are electrically connected to each other. In this case, the voltage at the first node N1 is set to the voltage of the reference power source Vref.

The voltage Vsg of the first transistor M1 is set to a voltage obtained by subtracting the voltage of the reference power source Vref from the voltage obtained by adding the absolute threshold voltage of the first transistor M1 to the voltage of the data signal. Here, the voltage of the reference power source Vref is a fixed voltage, and therefore, the amount of current flowing through the first transistor M1 is determined by the voltage of the data signal and the threshold voltage of the first transistor M1.

Meanwhile, the second transistor M2 is turned on for each horizontal line as the scan signal is progressively supplied to the scan lines S1 to Sn during the fourth period T4. Then, the data signal supplied from the data line Dm is stored in the first capacitor C1.

Practically, in the disclosed technology, a predetermined gray scale is implemented by repeating the aforementioned procedure. In the disclosed technology, the second capacitor C2 is not electrically connected to the first capacitor C1 during a period when the second capacitor C2 is charged, and accordingly, it is possible to minimize the capacity of the first capacitor C1. Further, the compensation period of the threshold voltage can be sufficiently secured by controlling the supply period of the second control signal to the second control line CL2, thereby improving display quality. Furthermore, the first power source ELVDD and the second power source ELVSS maintain a static voltage during the one frame in the pixel 142 according to this embodiment, so that it is possible to reduce power consumption and EMI.

Figure 4:
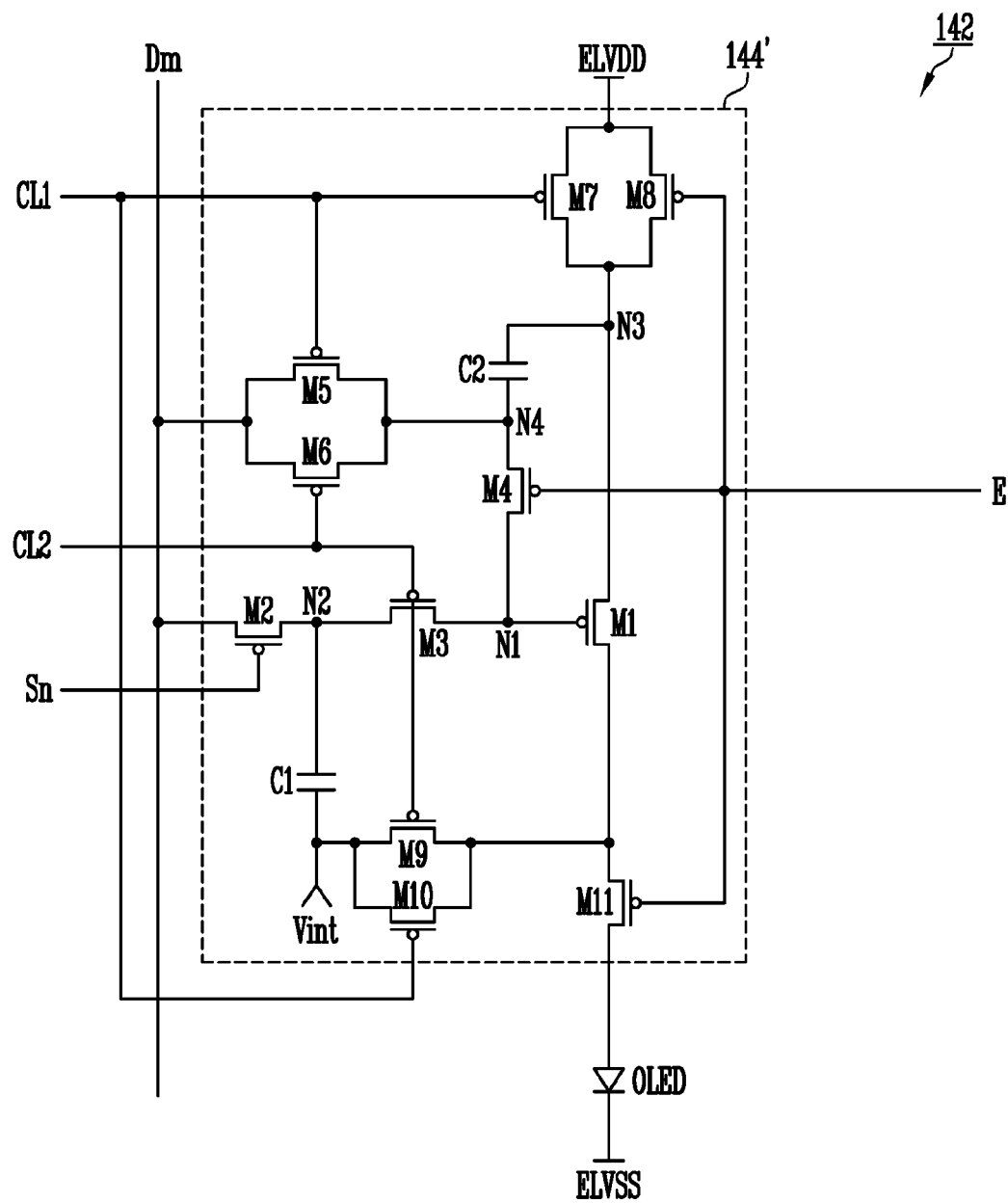
FIG. 4 is a circuit diagram illustrating a second exemplary embodiment of the pixel shown in FIG. 1.

FIG. 4 is a circuit diagram illustrating a second embodiment of the pixel shown in FIG. 1. In FIG. 4, components identical to those of FIG. 2 are designated by like reference numerals, and their detailed descriptions will be omitted.

Referring to FIG. 4, the pixels 142 according to this embodiment each include an organic light emitting diode OLED and a pixel circuit 144'.

The pixel circuit 144' includes a tenth transistor M10 and an eleventh transistor M11. The tenth transistor M10 is connected to the initialization power source Vint and a common node of the ninth and first transistors M9 and M1. The eleventh transistor M11 is connected to the common node and the anode electrode of the organic light emitting diode OLED.

The tenth transistor M10 is turned on when the first control signal is supplied to the first control line CL1. If the tenth transistor M10 is turned on, the voltage of the initialization power source Vint is applied to the common node of the first transistor M1 and the ninth transistor M9. Then, a voltage of the initialization power source Vint is applied to the common node and the anode electrode of the organic light emitting diode OLED during the first period T1. Accordingly, the organic light emitting diode OLED can be initialized.

The eleventh transistor M11 is turned on when the emission control signal is supplied to the emission control line E. The eleventh transistor M11 is turned off when the emission control signal is not supplied to the emission control line E. That is, the eleventh transistor M11 is turned on during the first period T1 and the fourth period T4, and is turned off during the second period T2 and the third period T3.

The eleventh transistor M11 lowers the voltage at the anode electrode of the organic light emitting diode OLED during the fourth period T4 that is an emission period so that a natural black image is implemented. In other words, the supply of the emission control signal to the emission control line E is stopped during the fourth period T4, and hence the voltage of the emission control line E is lowered. In this case, the voltage at the anode electrode of the organic light emitting diode OLED is dropped by a parasitic capacitor of the eleventh transistor M11, and accordingly, it is possible to improve the expression ability of the black image.

Figure 5:
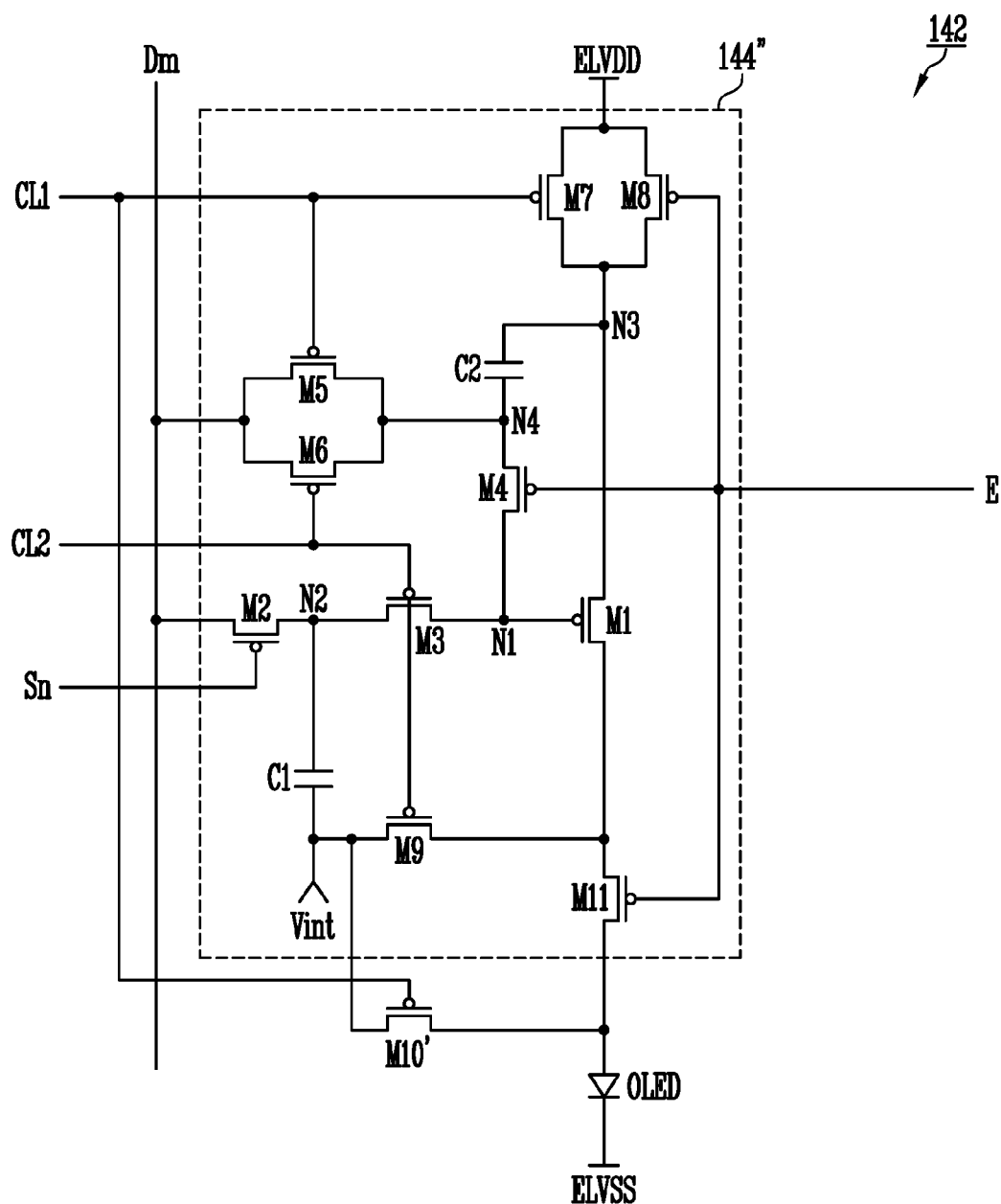
FIG. 5 is a circuit diagram illustrating a third exemplary embodiment of the pixel shown in FIG. 1.

FIG. 5 is a circuit diagram illustrating a third embodiment of the pixel shown in FIG. 1. In FIG. 5, components identical to those of FIG. 2 are designated by like reference numerals, and their detailed descriptions will be omitted.

Referring to FIG. 5, the pixel 142 according to this embodiment includes an organic light emitting diode OLED and a pixel circuit 144".

The pixel circuit 144" includes a tenth transistor M10' connected to the anode electrode of the organic light emitting diode OLED and the initialization power source Vint, and an eleventh transistor M11 connected to the anode electrode of the organic light emitting diode OLED and a common node of the ninth and first transistors M9 and M1.

The tenth transistor M10' is turned on when the first control signal is supplied to the first control line CL1. If the tenth transistor M10' is turned on, the voltage of the initialization power source Vint is applied to the anode electrode of the organic light emitting diode OLED so that the organic light emitting diode OLED is initialized.

The eleventh transistor M11 is turned on when the emission control signal is supplied to the emission control line E, and is turned off when the emission control signal is not supplied to the emission control line E. The eleventh transistor M11 lowers the voltage at the anode electrode of the organic light emitting diode OLED during the fourth period T4 so that a natural black image is implemented.

Meanwhile, although it has been described in the disclosed technology that the transistors are shown as PMOS transistors for convenience of illustration, the disclosed technology is not limited thereto. In other words, the transistors may be formed as NMOS transistors.

In the disclosed technology, the organic light emitting diode OLED generates red, green and blue light in response to the amount of current supplied from the driving transistor. However, the disclosed technology is not limited thereto. In one exemplary implementation, the organic light emitting diode OLED may generate white light in response to the amount of the current supplied from the driving transistor. In this case, a color image is implemented using a separate color filter or the like.

By way of summation and review, an organic light emitting diode display includes a plurality of pixels arranged in a matrix form at intersection portions of a plurality of data lines, a plurality of scan lines and a plurality of power lines. Each pixel generally includes an organic light emitting diode, two or more transistors including a driving transistor, and one or more capacitors.

The organic light emitting diode display has low power consumption. However, the amount of current flowing through the organic light emitting diode depending on a variation in threshold voltage of the driving transistor of each pixel, and therefore, display inequality is caused. That is, the characteristic of the driving transistor is changed depending on manufacturing process variables of the driving transistor of each pixel. Practically, the manufacturing of the organic light emitting diode display so that all the transistors have the same characteristic is impossible in the current process conditions. Accordingly, there occurs a variation in threshold voltage of the driving transistor.

In order to solve such a problem, there has been proposed a method of adding, to each pixel, a compensation circuit including a plurality of transistor and a capacitor. The compensation circuit of each pixel charges a voltage corresponding to the threshold voltage of a driving transistor during one horizontal period, and accordingly, a variation in the threshold voltage of the driving transistor is compensated.

Meanwhile, a method has recently been required, in which the compensation circuit is driven at a driving frequency of 120 Hz or more in order to prevent a motion blur phenomenon and/or to implement 3D images. However, in a case where the compensation circuit is driven at a high frequency of 120 Hz or more, the period required to charge the threshold voltage of the driving transistor is shortened, and therefore, it is impossible to compensate for the threshold voltage of the driving transistor. Additionally, it has been proposed a structure in which the driving power sources (first and second power sources ELVDD and ELVSS) are changed to correspond to the high-speed driving, but high power consumption and EMI occur when the driving power sources are changed.

In the disclosed pixels and the organic light emitting diode display using the same according to the disclosed technology, the disclosed pixels can compensate for a threshold voltage so that it is possible for the disclosed pixels to sufficiently secure a compensation period of the threshold voltage and therefore, improve display quality of the organic light emitting diode display. Further, because driving power sources are not changed and maintain a static voltage, it is possible for the organic light emitting diode display to minimize power consumption and EMI.

In addition, the first capacitor of the disclosed pixel configured to primarily charge a data signal is electrically decoupled from the second capacitor of the disclosed pixel. The second capacitor is connected to the gate electrode of the driving transistor during a period when the first capacitor supplies a voltage to the gate electrode of the driving transistor. In other words, the second capacitor is not charged by sharing electric charge with the first capacitor. Therefore, it is possible to minimize the capacity of the first capacitor.

For purposes of summarizing the disclosed technology, certain aspects, advantages and novel features of the disclosed technology have been described herein. It is to be understood that not necessarily all such advantages may be achieved in accordance with any particular embodiment of the disclosed technology. Thus, the disclosed technology may be embodied or carried out in a manner that achieves or optimizes one advantage or group of advantages as taught herein without necessarily achieving other advantages as may be taught or suggested herein.

Various modifications of the above described embodiments will be readily apparent, and the generic principles defined herein may be applied to other embodiments without departing from the spirit or scope of the disclosed technology. Thus, the disclosed technology is not intended to be limited to the embodiments shown herein but is to be accorded the widest scope consistent with the principles and novel features disclosed herein.

Exemplary embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the disclosed technology as set forth in the following claims.

What is claimed is:

1. An organic light emitting diodes (OLED) pixel circuit comprising:
   an organic light emitting diode;
   a first transistor including:
      a gate electrode connected to a first node,
      a first electrode connected to a first power source via a third node, and
      a second electrode connected to an anode electrode of the organic light emitting diode;
   a second transistor connected to a data line and a second node, the second transistor configured to be turned on when a scan signal is supplied to a scan line;
   a first capacitor connected to the second node and a fixed voltage source;
   a third transistor connected to the first node and the second node, the third transistor configured to be turned on when a second control signal is supplied;
   a fourth transistor connected to the first node and the third node, the fourth transistor being turned off when an emission control signal is supplied to an emission control line and turned on otherwise;
   a second capacitor connected to the third node and the fourth transistor;
   a seventh transistor connected to the third node and the first power source, the seventh transistor configured to be turned on when a first control signal is supplied; and
   a second control transistor connected to the third node and the first power source, the second control transistor configured to be turned on or turned off simultaneously with the fourth transistor.

2. The pixel circuit of claim 1, wherein a turn-on period of the fourth transistor does not overlap with a turn-on period of the third transistor.

3. The pixel circuit of claim 1, wherein a turn-on period of the seventh transistor does not overlap with a turn-on period of the third transistor.

4. The pixel circuit of claim 1, wherein a turn-on period of fourth transistor partially overlaps with a turn-on period of the seventh transistor.

5. The pixel circuit of claim 1, further comprising:
   a fifth transistor connected to the data line and a fourth node that is a common node between the second capacitor and the fourth transistor, the fifth transistor configured to be turned on or turned off simultaneously with the seventh transistor;
   a sixth transistor connected to the fourth node and the data line, the sixth transistor configured to be turned on or turned off simultaneously with the third transistor; and
   a ninth transistor connected to the fixed voltage source and the anode electrode of the organic light emitting diode, the ninth transistor configured to be turned on or turned off simultaneously with the third transistor.

6. The pixel circuit of claim 5, wherein a voltage of the fixed voltage source is set so that current flows through the first transistor when the ninth transistor is turned on.

7. The pixel circuit of claim 5, further comprising:
   a tenth transistor connected to the fixed voltage source and a common node of the first transistor and the ninth transistor, the tenth transistor configured to be turned on or turned off simultaneously with the fifth transistor; and
   an eleventh transistor connected to the organic light emitting diode and the common node, the eleventh transistor configured to be turned on or turned off simultaneously with the fourth transistor.

8. The pixel circuit of claim 5, further comprising:
   a tenth transistor connected to the fixed voltage source and the organic light emitting diode, the tenth transistor being simultaneously turned on or turned off with the fifth transistor; and
   an eleventh transistor connected to the organic light emitting diode and the common node, the eleventh transistor configured to be turned on or turned off simultaneously with the fourth transistor.

9. An organic light emitting diode display, comprising:
   a control driver configured to supply a first control signal to a first control line during a first period and a second period of a frame, and supply a second control signal to a second control line during a third period of the frame;
   a scan driver configured to progressively supply a scan signal to scan lines during a fourth period of the frame and supply an emission control signal to an emission control line during the second period and the third period;
   a data driver configured to supply a bias voltage to data lines during the first period, supply a reference power source to the data lines during the second period and the third period, and supply a data signal to the data lines during the fourth period; and
   pixels positioned in an area defined by the scan lines and the data lines, the pixels each including a first transistor, a first capacitor and a second capacitor,
   wherein each pixel stores a voltage in response to a voltage of the data signal in the first capacitor during the fourth period, and charges in the second capacitor a voltage in response to the voltage of the data signal and a threshold voltage of the first transistor using the voltage stored in the first capacitor during the third period, the second capacitor electrically disconnected from the first capacitor.

10. The display of claim 9, wherein the data driver supplies an on-bias voltage at which the first transistor is turned on during the first period.

11. The display of claim 9, wherein the data driver supplies an off-bias voltage at which the first transistor is turned off during the first period.

12. The display of claim 9, wherein the reference power source is set to a specific voltage within a voltage range of the data signal.

13. The display of claim 9, wherein each of the pixels includes:
   an organic light emitting diode;
   a first transistor configured to have
      a gate electrode connected to a first node,
      a first electrode connected to a first power source via a third node, and
      a second electrode connected to an anode electrode of the organic light emitting diode;
   a second transistor connected to a specific data line and a second node, the second transistor configured to be turned on when a scan signal is supplied to a scan line;

a first capacitor connected to the second node and a fixed voltage source;

a third transistor connected to the first node and the second node, the third transistor configured to be turned on when the second control signal is supplied;

a fourth transistor connected to the first node and the third node, the fourth transistor configured to be turned on when the emission control signal is supplied and be turned off when the emission control signal is not supplied;

a second capacitor connected to the fourth transistor and the third node;

a first control transistor connected to the third node and the first power source, the first control transistor being turned on when the first control signal is supplied; and a second control transistor connected in parallel to the first control transistor between the third node and the first power source, the second control transistor configured to be turned off when the emission control signal is supplied and turned on when the emission control signal is not supplied.

14. The display of claim 13, wherein a turn-on period of the fourth transistor does not overlap with a turn-on period of the third transistor.

15. The display of claim 13, wherein a turn-on period of the first control transistor does not overlap with a turn-on period of the third transistor.

16. The display of claim 13, wherein a turn-on period of fourth transistor partially overlaps with a turn-on period of the first control transistor.

17. The display of claim 13, wherein each pixel further includes:

a fifth transistor connected to the specific data line and a fourth node that is a common node of the second capacitor and the fourth transistor, the fifth transistor configured to be turned on when the first control signal is supplied;

a sixth transistor connected in parallel to the fifth transistor between the fourth node and the specific data line, the sixth transistor configured be turned on when the second control signal is supplied; and a ninth transistor connected to the fixed voltage source and the anode electrode of the organic light emitting diode, the ninth transistor configured be turned on when the second control signal is supplied.

18. The display of claim 17, wherein a voltage of the fixed voltage source is set so that current flows through the first transistor when the ninth transistor is turned on.

19. The display of claim 17, wherein each pixel further includes:

a tenth transistor connected to the fixed voltage source and a common node of the ninth and first transistors, the tenth transistor being turned on when the first control signal is supplied; and an eleventh transistor connected to the organic light emitting diode and the common node of the ninth and first transistors, the eleventh transistor configured to be turned off when the emission control signal is supplied and turned on when the emission control signal is not supplied.

20. The display of claim 17, wherein each pixel further includes:

a tenth transistor connected to the fixed voltage source and the organic light emitting diode, the tenth transistor being turned on when the first control signal is supplied; and an eleventh transistor connected to the organic light emitting diode and the common node of the ninth and first transistors, the eleventh transistor configured to be turned off when the emission control signal is supplied and turned on when the emission control signal is not supplied.

* * * * *